United States Patent
Zeller

(10) Patent No.: US 10,302,724 B2
(45) Date of Patent: May 28, 2019

(54) MULTI-SLICE GRADIENT ECHO MAGNETIC RESONANCE IMAGING

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 183 days.

(21) Appl. No.: 15/410,070

(22) Filed: Jan. 19, 2017

(65) Prior Publication Data
US 2017/0205486 A1    Jul. 20, 2017

(30) Foreign Application Priority Data

Jan. 19, 2016    (DE) .................. 10 2016 200 603

(51) Int. Cl.
*G01V 3/00*       (2006.01)
*G01R 33/56*      (2006.01)
*G01R 33/50*      (2006.01)
(Continued)

(52) U.S. Cl.
CPC ..... *G01R 33/5608* (2013.01); *G01R 33/4835* (2013.01); *G01R 33/50* (2013.01); *G01R 33/56554* (2013.01); *G01R 33/56563* (2013.01)

(58) Field of Classification Search
CPC ............ G01R 33/5608; G01R 33/4835; G01R 33/50; G01R 33/56554; G01R 33/56563
(Continued)

(56) References Cited

U.S. PATENT DOCUMENTS

| 5,245,282 A | * | 9/1993 | Mugler, III | ........ | G01R 33/4835 |
| | | | | | 324/309 |
| 6,043,651 A | | 3/2000 | Heid | | |

(Continued)

OTHER PUBLICATIONS

Pfeuffer, et al., "Dynamic Phase Echo-Planar Imaging-Detection and Correction of Dynamic Off-Resonance," Proc. Intl. Soc. Mag. Reson. Med. 19 (2011).

(Continued)

*Primary Examiner* — Rodney E Fuller
(74) *Attorney, Agent, or Firm* — Schiff Hardin LLP

(57) ABSTRACT

A number of repetitions of a magnetic resonance measurement sequence and a number of repetitions of a navigator magnetic resonance measurement sequence are executed in a interleaved manner. Each repetition of the magnetic resonance measurement sequence includes the time-parallel creation of gradient echoes for measurement of magnetic resonance data. Each repetition of the navigator magnetic resonance measurement sequence includes the radiating of RF excitation pulse, the activation of at least one gradient pulse train for time-sequential creation of gradient echoes, and the read out of the gradient echoes as navigator magnetic resonance data. The magnetic resonance data are modified based on the navigator magnetic resonance data. This enables an N/2 ghosting artifact and/or a constant magnetic field drift and/or a movement artifact to be reduced. Such techniques can be applied in conjunction with simultaneous multi-slice echo planar magnetic resonance imaging, SMS EPI. Diffusion-weighted magnetic resonance imaging also is possible.

18 Claims, 7 Drawing Sheets

(51) Int. Cl.
*G01R 33/483* (2006.01)
*G01R 33/565* (2006.01)

(58) Field of Classification Search
USPC .......................................................... 324/309
See application file for complete search history.

(56) References Cited

U.S. PATENT DOCUMENTS

| | | | |
|---|---|---|---|
| 6,268,728 B1* | 7/2001 | Morrell | G01R 33/246 |
| | | | 324/307 |
| 6,424,153 B1 | 7/2002 | Liu et al. | |
| 6,614,225 B1 | 9/2003 | Feinberg | |
| 8,405,395 B2 | 3/2013 | Setsompop et al. | |
| 2012/0249138 A1 | 10/2012 | Pfeuffer | |
| 2013/0300410 A1 | 11/2013 | Niendorf et al. | |
| 2015/0084629 A1* | 3/2015 | Porter | G01R 33/54 |
| | | | 324/309 |
| 2016/0132746 A1* | 5/2016 | Saranathan | G06K 9/4633 |
| | | | 382/131 |
| 2017/0089999 A1 | 3/2017 | Zeller et al. | |
| 2017/0160366 A1 | 6/2017 | Tisdale et al. | |
| 2017/0219674 A1 | 8/2017 | VAn Der Kouwe et al. | |

OTHER PUBLICATIONS

Setsompop, et al., "Improving diffusion MRI using simultaneous multi-slice echo planar imaging," NeuroImage vol. 63 569-580; (2012).

Feinberg et al: "Simultaneous Echo Refocusing in EPI"; Magnetic Resonance Medicine vol. 48, pp. 1-5; (2002).

* cited by examiner

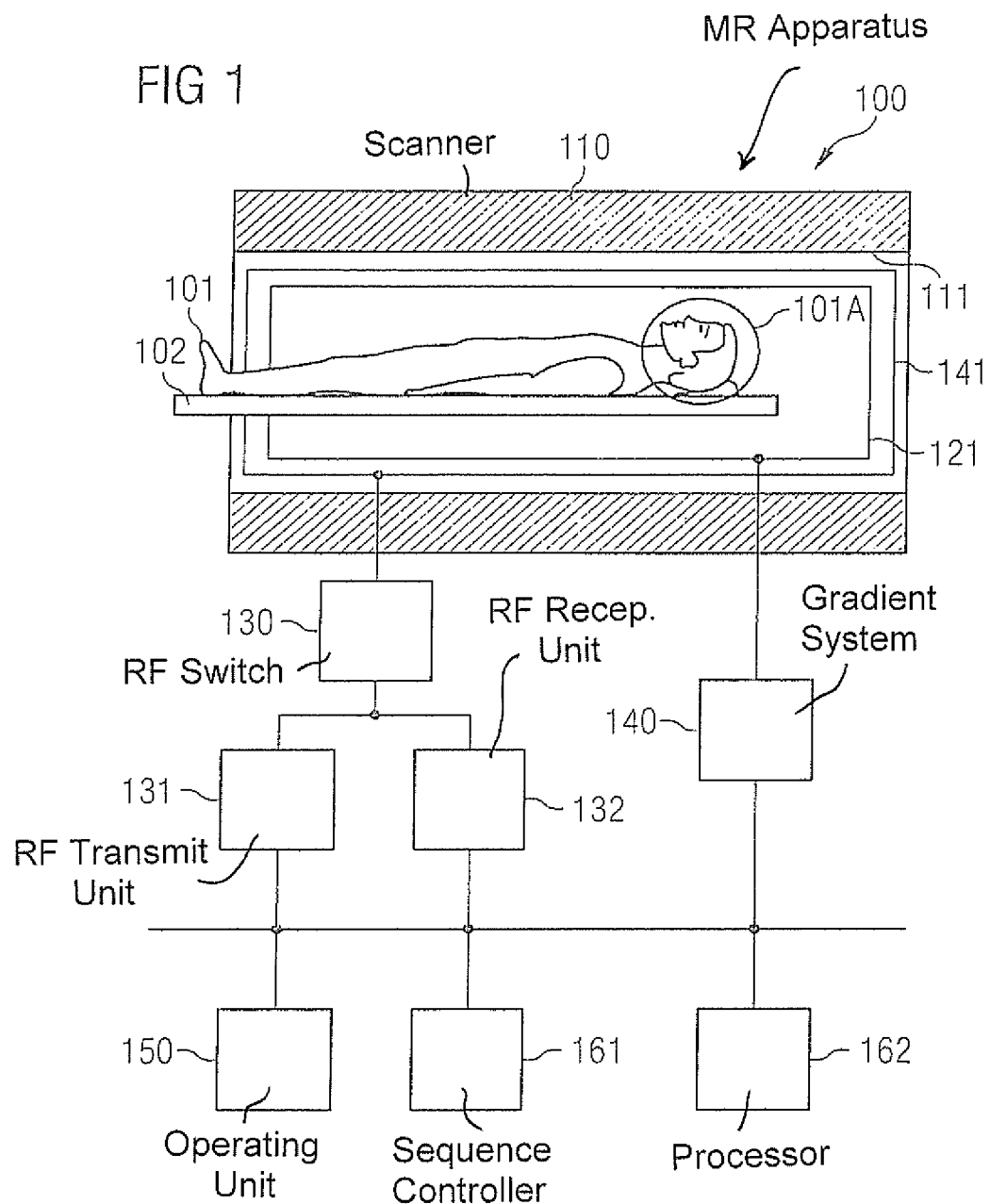

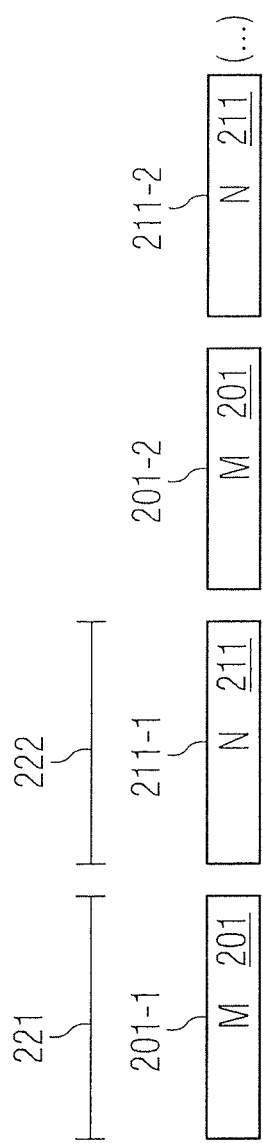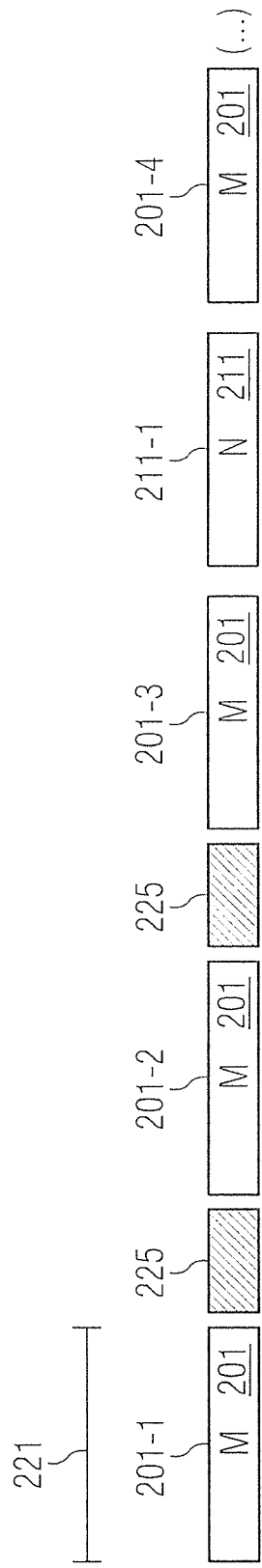

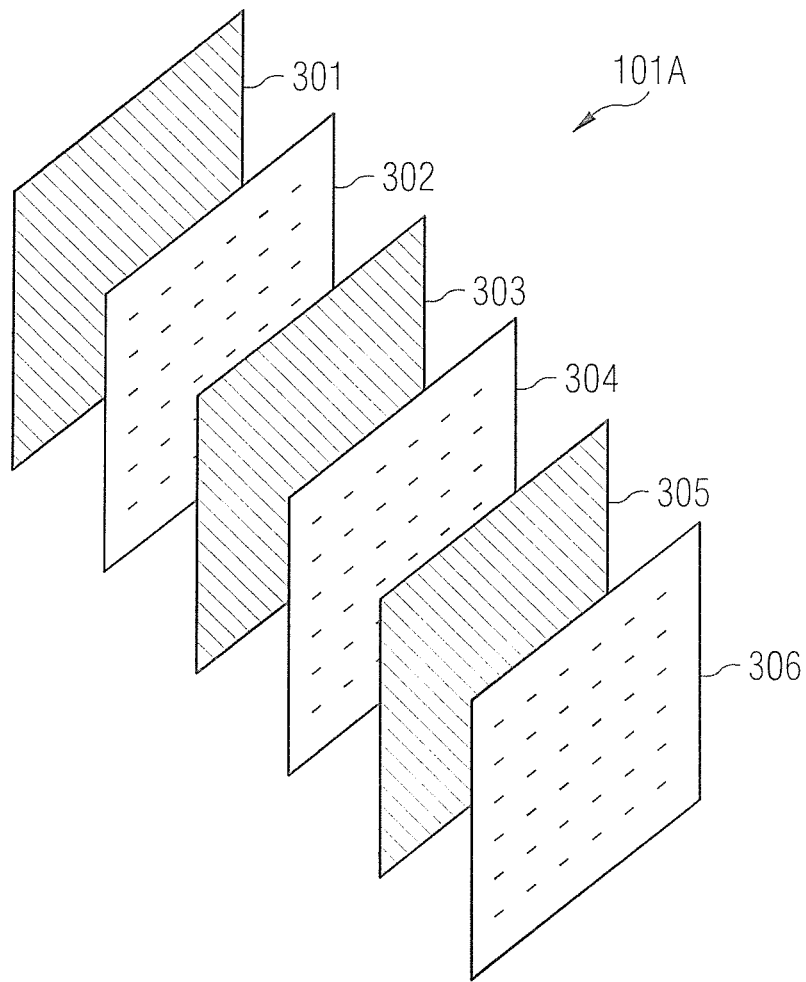

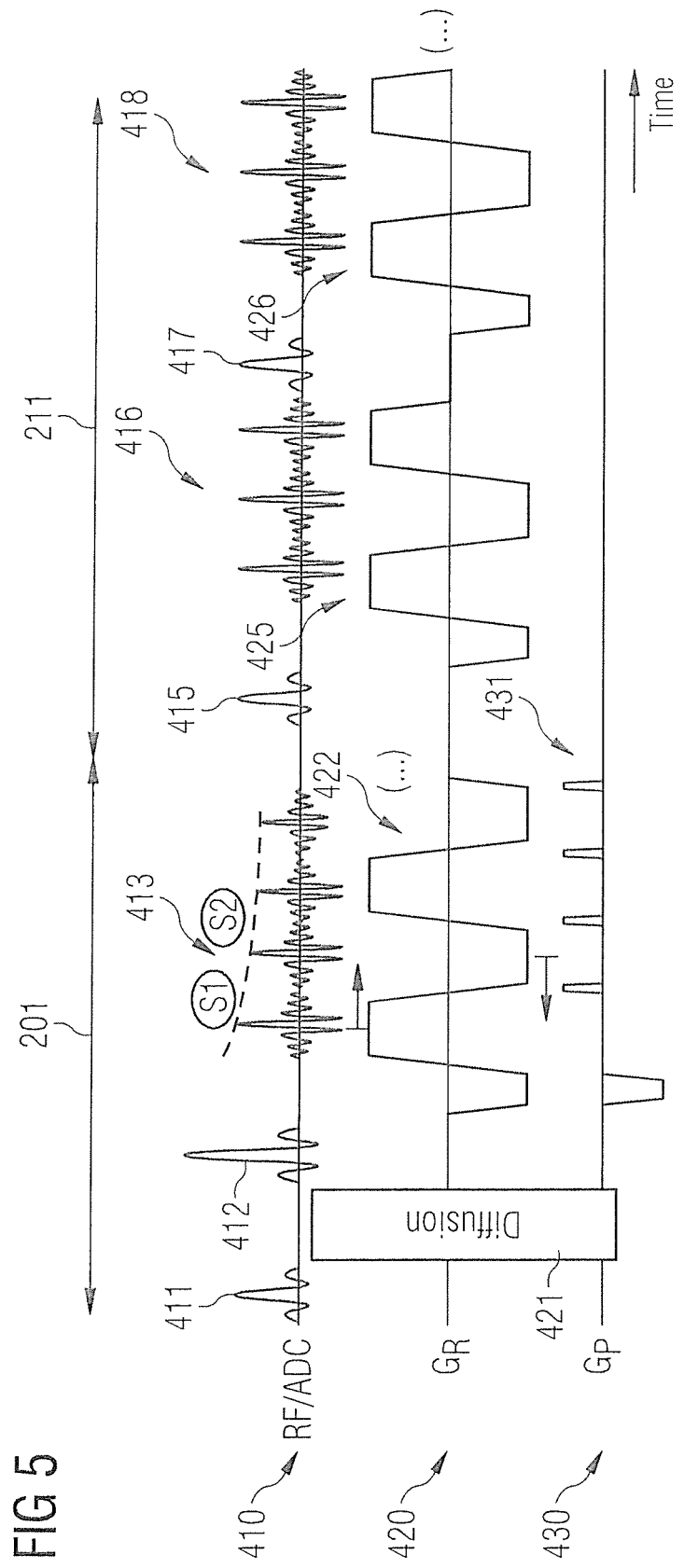

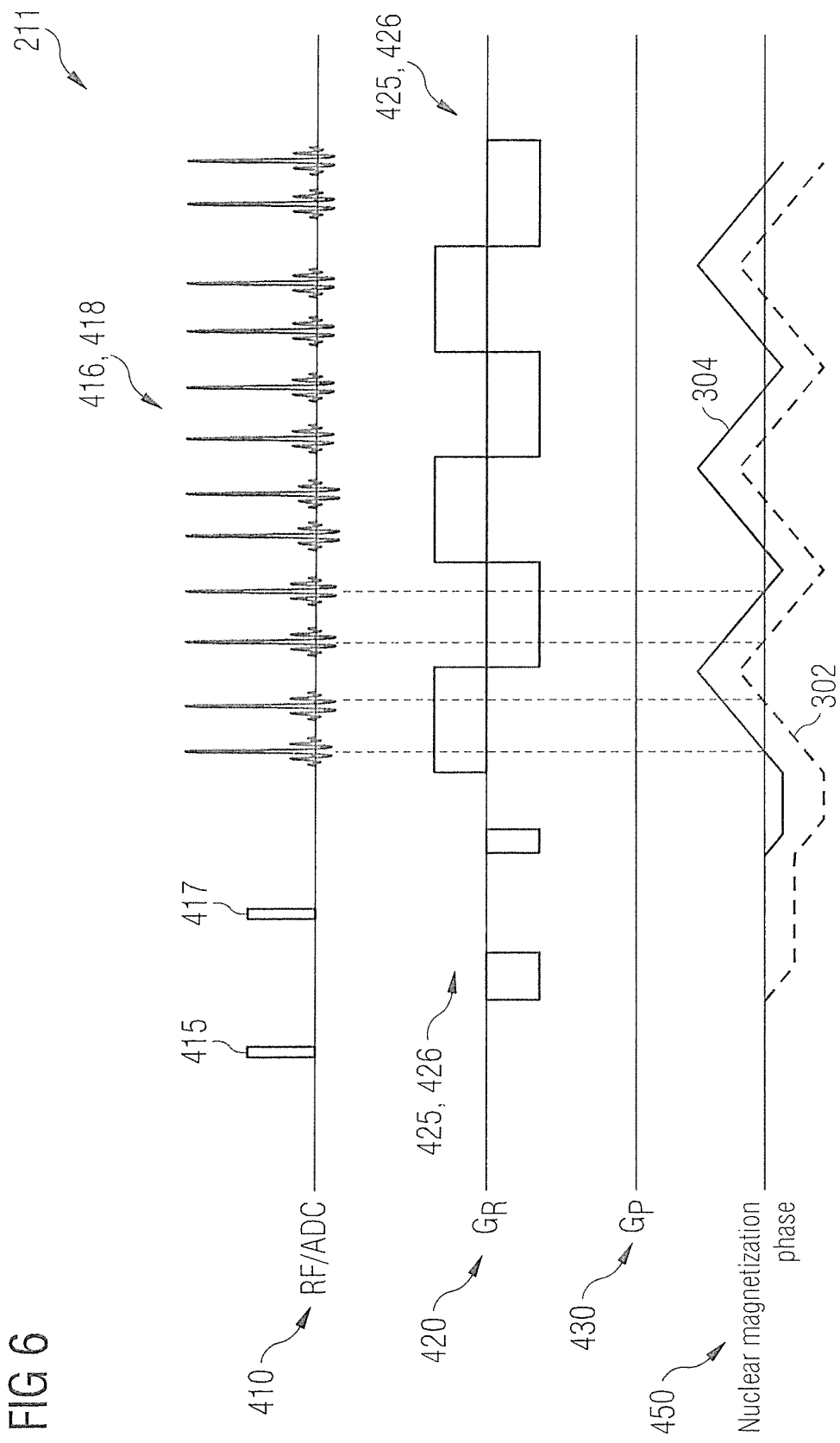

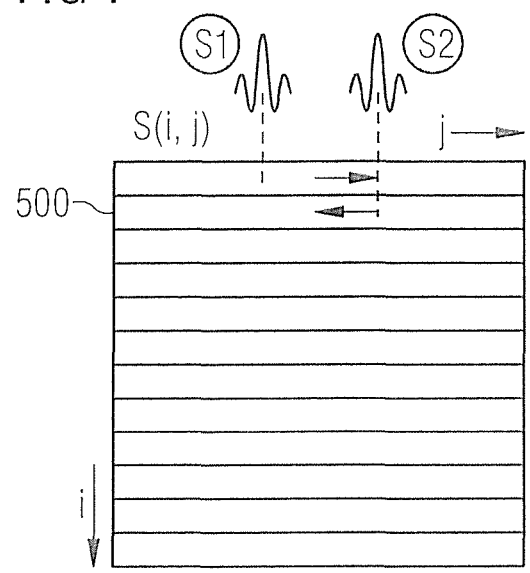
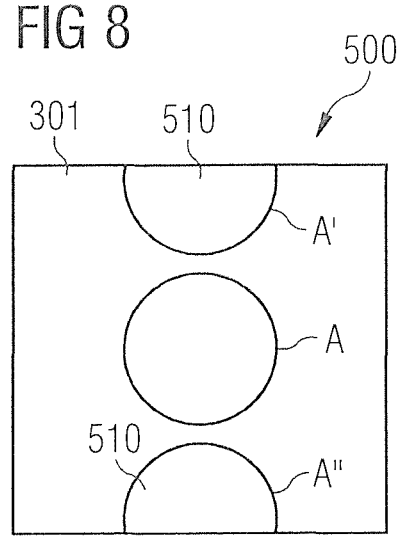

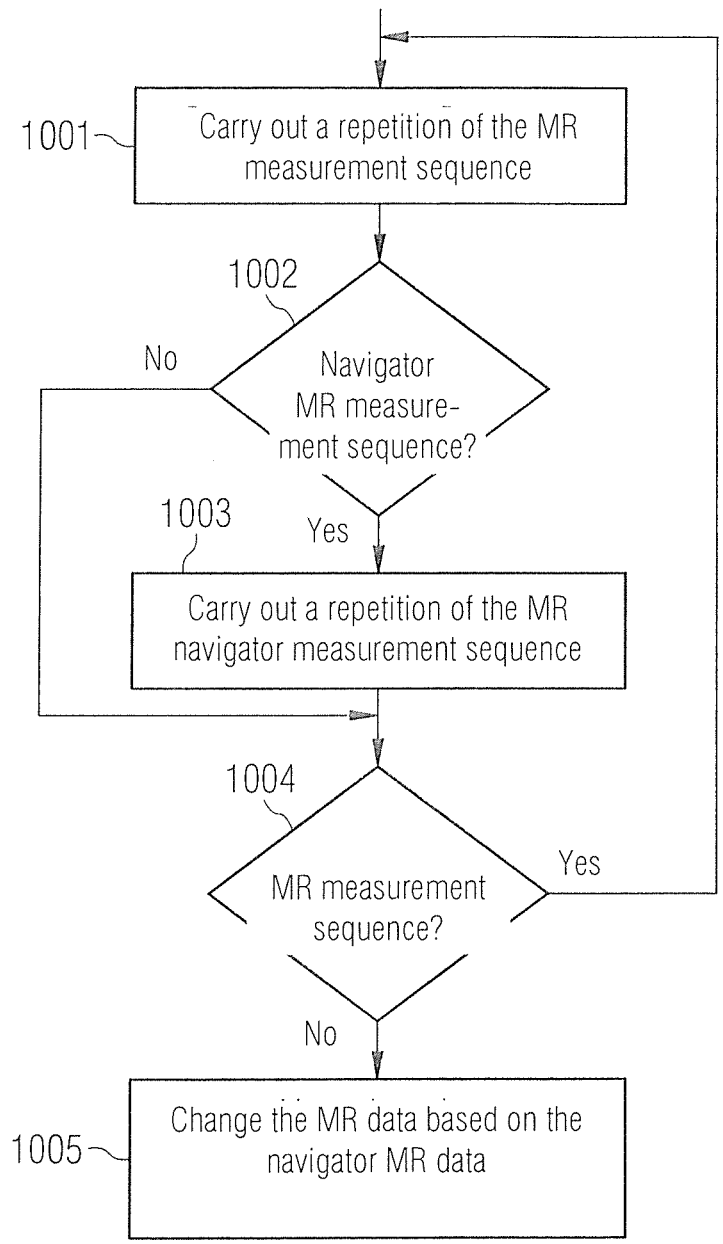

MULTI-SLICE GRADIENT ECHO MAGNETIC RESONANCE IMAGING

BACKGROUND OF THE INVENTION

Field of the Invention

The invention concerns a magnetic resonance imaging method of the type wherein a number of repetitions of a magnetic resonance measurement sequence and a number of repetitions of a navigator magnetic resonance measurement sequence are executed in a interleaved manner, wherein the phase of the magnetic resonance data that are obtained based on the magnetic resonance measurement sequence is changed on the basis of the navigator magnetic resonance data. The invention also concerns a magnetic resonance apparatus, and a storage medium encoded with programming instructions, for implementing such a method.

Description of the Prior Art

Magnetic resonance (MR) imaging is a technology for creating MR images that map an examination object. Typically the examination object is positioned in a constant magnetic field that is designed as statically and as homogeneously as possible, which has strength of between 0.5 Tesla and 5 Tesla, for example. The constant magnetic field aligns the nuclear magnetization of the examination object; in particular a polarization of the nuclear spin magnetization takes place in the direction of the constant magnetic field.

Radio-frequency (RF) pulses can then be radiated in order to deflect the nuclear magnetization from its rest position in the direction of the constant magnetic field, i.e. in order to excite the nuclear magnetization. The subsequent relaxation of the nuclear magnetization creates RF signals, so-called echoes. Within the framework of gradient echo MR imaging or echo planar MR imaging (EPI), so-called gradient echoes are explicitly created by gradient pulses being applied for rephasing and dephasing the nuclear magnetization.

Gradient pulses are applied for spatially encoding the MR data. The gradient pulses create gradient magnetic fields (gradient fields) that are superimposed on the constant magnetic field.

The MR data can be measured during a readout phase. Frequently the acquired MR data are referred to as raw data. The MR data can be processed in order to reconstruct the MR image of the examination object. For example, the measured MR data are typically digitized and are initially present as data entries in the spatial frequency space (k-space). On the basis of a Fourier transformation, it is then possible to transform the MR data into the image space in order to create the MR image.

Within EPI, it can be possible for the MR data to exhibit artifacts that adversely affect the imaging of the examination object. The gradient pulse train that is typically applied within the framework of the EPI has a number of gradient pulses of different polarity in a sequential order. Depending on polarity, the gradient echoes will sometimes be referred to as even or odd. Because of the alternating polarity of the gradient pulses of the gradient pulse train, MR data for different rows of k-space are measured in an alternating direction. This means, for example, that if the data entry trajectory in k-space is row-by-row, the MR data are entered from left to right for a first row and for a second row, in k-space adjacent to the first row, the data are entered from right to left.

In EPI, errors of the phase (phase errors) of the MR data can cause artifacts. This can result in shifts of the phase of the MR data for rows in k-space with a different entry direction, as described above. This can occur, for example, because of imprecise timing during application of the gradient pulses and/or during digitization within the framework of the measurement of the MR data and/or because of eddy current effects. Such an offset of the phase of the MR data in adjacent rows of k-space can lead to so-called N/2 ghosting artifacts. Such an N/2 ghosting artifact can occur in the MR image as "ghost" mapping of the examination object and typically has a lower intensity than the actual mapping of the examination object, and may also be shifted in the positive and/or negative direction in relation to the actual mapping.

A further source for errors in the phase of the MR data can be a temporal dependency of the amplitude and/or of the direction of the constant magnetic field (drift). A typical cause for a drift of the constant magnetic field is, for example, heating or mechanical vibration of the hardware of the MR system while the EPI is being carried out. Typical artifacts that can occur as a result of the temporal drift of the constant magnetic field include loss of contrast, shifting of the object in the reconstructed image in the phase encoding direction, for example.

Techniques for reduction of such artifacts in EPI are known. For example a technique is known from U.S. Pat. No. 6,043,651 for correcting the phase on the basis of navigator MR data. Through the reduction of the artifacts it can be achieved that the quality of the MR images is improved and thereby that there is a greater information content in the MR images. The imaging will be improved. In the medical field this enables more precise diagnoses to be made or errors to be avoided during diagnosis. The entire content of the disclosure of U.S. Pat. No. 6,043,651 relating to the change of phase of MR data for reduction of artifacts is incorporated herein by reference. U.S. Pat. No. 6,043,651 describes how a phase offset between even and odd gradient echoes, i.e. gradient echoes with opposing readout direction, can be reduced by correlation of the MR data on the basis of the navigator MR data. A retrospective alignment of the odd and even gradient echoes can be achieved to compensate for a phase offset.

Furthermore a technique is known from US 2012/0249138 A1 for reducing artifacts resulting from a drift of the constant magnetic field (dynamic off-resonance in k-space, DORK). The entire content of the disclosure of US 2012/0249138 A1 relating to the change of phase of MR data for reduction of artifacts is incorporated herein by reference. US 2012/0249138 A1 describes how the constant magnetic field drift can be determined by comparing the phase evolution of echoes with identical polarities of the readout gradient pulses between consecutively measured MR data. Typically, within the framework of the DORK technology, such a computation will be carried out averaged over an entire imaging region.

For specific forms of EPI it can be difficult to apply such known techniques for reduction of artifacts. For example, within the framework of simultaneous multi-slice (SMS) EPI, in which the nuclear magnetization is excited in a number of slices of the examination object by radiating a suitable RF excitation pulse, and gradient echoes of the nuclear magnetization excited by the RF excitation pulses are created in parallel in time, it can be impossible or only possible to a restricted extent to have direct access to the navigator MR data, in order to make the corresponding corrections as described above. Such techniques are sometimes also referred to as slice multiplexing techniques.

It can be necessary, for example in reference implementations, to obtain navigator MR data on the basis of gradient pulses, which are subsequently applied directly within the framework of the simultaneous multi-slice imaging to a corresponding RF excitation pulse. A phase encoding of the gradient echoes of the navigator MR data takes place, so that a separation based on SMS technology is possible. This enables the echo time TE between excitation and creation of the echo for gradient echoes of the SMS EPI to be extended, which typically is disadvantageous for the quality of the MR imaging. Sometimes the temporal resolution can also be restricted with such approaches, since only half of the correction information can be obtained per navigator for example. Also in such a case the quality of the MR imaging can be restricted. See U.S. patent application Ser. No. 14/868,529, for example.

Other reference implementations are based on a one-off preceding navigator MR measurement sequence. Such techniques cannot detect, or can only poorly detect, time dependencies of the phase errors during the measurement, so that imprecisions result. The drift of the constant magnetic field cannot be mapped or can only be mapped to a restricted extent. See, for example, SETSOMPOP K. et al., "Improving diffusion MRI using simultaneous multi-slice echo planar imaging" in NeuroImage 63 (2012) 569-580.

SUMMARY OF THE INVENTION

A need therefore exists for improved techniques for changing the phase of MR data that is measured on the basis of gradient echoes excited in parallel in time from a number of slices of an examination object. In particular a need exists for improved techniques for changing the phase of MR data that is obtained by SMS EPI. In particular a need exists for improved techniques for reduction of N/2 ghosting artifacts and of constant magnetic field drift within the framework of the EPI.

In the method according to the invention, a number of repetitions of an MR measurement sequence and a number of repetitions of a navigator MR measurement sequence are executed in a interleaved manner. Each repetition of the MR measurement sequence includes the radiating of a first RF excitation pulse. The first RF excitation pulse excites the nuclear magnetization in first slices of an examination object. Each repetition of the MR measurement sequence further includes the activation of a phase-encoded first gradient pulse train that produce time-parallel first gradient echoes of the nuclear magnetization excited by the first RF excitation pulse. Each repetition of the MR measurement sequence further includes the read out of the first gradient echoes as MR data. Each repetition of the navigator MR measurement sequence includes the radiating of at least one second RF excitation pulse. The second RF excitation pulse excites the nuclear magnetization in second slices of the examination object. Each repetition of the navigator MR measurement sequence further includes the activation of at least one second gradient pulse train that produce time-sequential second gradient echoes of the nuclear magnetization excited by the second RF excitation pulse. Each repetition of the navigator MR measurement sequence further includes the read out of the second gradient echoes as navigator MR data. The method further includes modifying the MR data based on the navigator MR data, and making the modified MR data available in electronic form, as a data file.

For example, the phase of the MR data can be modified based on the navigator MR data. As an alternative or in addition, the amplitude of the MR data can be modified based on the navigator MR data. For example, a movement correction can be carried out. As an alternative or in addition, a constant magnetic field drift in the magnetic resonance data and/or N/2 ghost artifacts in the magnetic resonance data can be reduced.

For example, the MR measurement sequence can be configured in accordance with SMS EPI. For example, the first RF excitation pulse can excite the nuclear magnetization in all first slices of the examination object in parallel in time.

Through the time-parallel excitation and/or creation of the first gradient echoes the MR data are typically overlaid or collapsed for the first slices. The method can further include separation of the MR data for obtaining slice specific MR data for each of the first slices. For example, the already-separated, i.e. slice-specific MR data can be modified based on the navigator MR data.

For separation or decollapsing of the MR data for the first slices, a technique used for parallel imaging (partial parallel acquisition, PPA) can be employed, which features a slice specific reconstruction kernel for each of the first slices. The method the further includes separation of the MR data based on slice specific reconstruction kernels of a PPA technique. Typically, the separation of the MR data based on slice specific reconstruction kernels is based on calibration MR data having been acquired for the reconstruction kernels with a specific phase encoding, which will also be used for the MR data.

Ppa techniques make it possible to scan (entered acquired MR data into) k-space at a frequency that is intentionally so low that data are not entered at every possible data entry point in k-space. This is known as undersampling of k-space. The missing scanning points of the MR data are then reconstructed by application of a reconstruction kernel. Suitable techniques relating to SMS EPI are described in SETSOMPOP K. et al., "Improving diffusion MRI using simultaneous multi-slice echo planar imaging" in NeuroImage 63 (2012) 569-580, and in U.S. Pat. No. 8,405,395, the contents of both being incorporated herein by reference.

A set of slice-specific reconstruction kernels for the first slices can be established, for example, during a calibration phase. The calibration phase can be carried out, for example, before or after the interleaved execution of the multiple repetitions of the MR measurement sequence and the multiple repetitions of the navigator MR measurement sequence. For example, the calibration phase can be carried out before the separation of the MR data. For example, the calibration phase can be the implementation of a calibration measurement sequence. Such a calibration measurement sequence can include the radiating of at least one third RF excitation pulse, which excites the nuclear magnetization in the first slices of the examination object. For example the calibration measurement sequence can include the activation of at least one phase-encoded third gradient pulse train for time-sequential creation of third gradient echoes of the nuclear magnetization excited by the third RF excitation pulse. In this case the phase encoding of the third gradient pulse train can be the same as the phase encoding of the first gradient pulse train, which is used for creating the first gradient echoes within the framework of the MR measurement sequence; this can make possible the separation of the MR data for obtaining the slice-specific MR data on the basis of the PPA technique. For example, the calibration measurement sequence can include the read out of the third gradient echoes as calibration MR data. On the basis of the calibration MR data, it is then possible to determine the slice specific reconstruction kernels for each of the first slices. The calibration MR data, for each of the first slices, may scan k-space with a higher resolution than the MR data, i.e. no undersampling of k-space occurs.

At least one parameter of the MR measurement sequence can be changed from repetition to repetition. The execution of the number of repetitions of the MR measurement sequence can serve different purposes in different examples. It is possible that the MR data for all rows of each of the first slices will be acquired per repetition of the MR measurement sequence; then other MR parameters can be changed as a function of the repetitions. In other examples it is possible that only a portion of the MR data will be acquired for the different rows of the first slices per repetition of the MR measurement sequence; in such a case it can be necessary for the MR data of a number of repetitions to be combined into a single MR image.

The navigator MR data can be interpreted as MR correction data that are used to reduce phase errors in the MR data. Techniques such as those described at the outset in relation to U.S. Pat. No. 6,043,651 and US 2012/0249138 A1 can be used for this purpose. In different embodiments, a wide variety of types of navigator MR data can be employed. For example the navigator MR data could feature no phase encoding, i.e. correspond to a sum of all rows of k-space for a specific second slice; in such an example it would be possible for the changing of the phase of the MR data to occur in the same way based on the navigator MR data for different rows of k-space, i.e. not row-specifically for different rows of k-space. In other embodiments, it would be possible for the navigator MR data to feature a phase encoding; in such a case it would be possible for the changing of the MR data to occur based on the navigator MR data specifically for different rows of k space. For example, a movement correction can take place. In such a case a physiological movement of the person being examined, which occurs as a function of the time, can be reduced. Examples for possible physiological movements include breathing, swallowing reflex, and heartbeat. Typically a row-specific correction of the MR data can exhibit a greater accuracy; at the same time, as a result of the required phase encoding of the navigator MR data, but an increased period of time for carrying out the navigator MR measurement sequence may be necessary.

When the navigator MR data have a phase encoding, the at least one second gradient pulse train can be phase encoded. For example it would be possible for the resolution of the MR data in the phase-encoding direction to be greater than the resolution of the navigator MR data in the phase-encoding direction. This can be achieved by the number of phase-encoding steps per first slice being greater than the number of phase-encoding steps per second slice. In this way, although a row-specific correction of the MR data can still be carried out, at the same time only a comparatively short period of time will be needed for carrying out the navigator MR measurement sequence. It is thus possible, for example, for movement artifacts to be compensated for or reduced.

The RF excitation pulses have an amplitude. The amplitude is a factor that determines the flip angle with which the respective RF excitation pulse deflects the nuclear magnetization from the rest position. In different embodiments it can be beneficial to use a comparatively small flip angle for the second RF excitation pulse. For example it is possible for the flip angle of the second RF excitation pulse to be smaller than the flip angle of the first RF excitation pulse. For example, the flip angle of the first RF excitation pulse could be >50°, preferably >65°, especially preferably >80°. It would then be possible, for example, for the flip angle of the second RF excitation pulse to lie in the range of 2-40°, preferably in the range of 3-10°. The use of a comparatively small flip angle for the second RF excitation pulse results in the nuclear magnetization in the second slices being excited only relatively weakly, i.e. it will be deflected only by a comparatively small amount. This enables the relaxation time to be dimensioned comparatively short, by which dead times during the different repetitions can be reduced. This enables the duration of the measurement to be reduced.

For example, the second RF excitation pulse that excites the nuclear magnetization in the respective second slice slice-selectively can be radiated in each case for each repetition of the navigator MR measurement sequence and for each second slice. For example, the second gradient echoes can be created for each of the second slices at different times by the application of the at least one second gradient pulse train. This means that by the time-sequential excitation of the nuclear magnetization and/or the time-sequential creation of the second gradient echoes, the navigator MR data can be present not overlaid or not collapsed for the second slices. This means that a direct access to the navigator MR data for each of the second slices is possible. The separation of the navigator MR data for obtaining slice-specific navigator MR data for each of the second slices is then unnecessary. A reconstruction on the basis of a PPA technique with slice specific reconstruction kernels, as described above, is then unnecessary for the navigator MR data. This allows non-phase-encoded navigator MR data to be acquired and used for changing the phase of the MR data. In further embodiments, it is possible to undertake a phase encoding of the navigator MR data. Since there does not have to be any recourse to the slice-specific reconstruction kernel, it is possible for this phase encoding of the navigator MR data to be different from the phase encoding of the MR data, for which the slice-specific reconstruction kernels are present. The distances between rows of k-space can then be chosen flexibly. A mapped area (field of view, FOV) could be chosen flexibly, for example.

A wide variety of techniques can be used for reduction of the period of time needed for carrying out the navigator MR measurement sequence. For example techniques of simultaneous echo refocusing (SER) can be used. This means that, per repetition of the navigator MR measurement sequence, a single second gradient pulse train is activated, which creates all second gradient echoes of the respective repetition. This single second gradient pulse train can create the second gradient echoes by a corresponding offset of the phase angles of the nuclear magnetization of the different second slices time sequentially. Suitable SER techniques are known, for example, from U.S. Pat. No. 6,614,225. As an alternative or in addition PPA techniques can be employed, for example when phase encoding of the navigator MR data is present.

It can thus be possible, with the techniques described herein, to implement the modification of the phase of the MR data based on the navigator MR data especially simply, with lower susceptibility to errors and/or especially quickly.

For example, the modification of the phase for reduction of phase errors can occur in the MR data. A reduction of the constant magnetic field drift in the MR data and/or a reduction of N/2 ghosting artifacts in the MR data, can be implemented.

For example the phase of the (slice specific) MR data can be modified for a specific first slice based on the navigator MR data at least of a specific second slice. Here the at least one specific second slice can be in a spatial relationship to the specific first slice. For example the at least one specific second slice can be arranged adjoining the first slice in the examination object. As an alternative or in addition, it would also be possible for the at least one specific second slice can be arranged adjacent to the first slice in the examination object. Such slice-specific criteria relating to the spatial relationship can be especially well fulfilled when the totality of the first slices has a specific spatial relationship to the totality of the second slices.

An especially precise modification of the phase of the MR data, for example in relation to the N/2 ghosting artifacts, can also be achieved when the first slices are in a specific spatial relationship to the second slices. For example the first slices and the second slices can be identical. It is also possible for a second slice to be arranged between adjacent first slices in each case. It is also possible for both the first slices and the second slices to be arranged within an examination region of the examination object, for which MR imaging is carried out on the basis of the measured MR data. For example, the number of the first slices can be equal to the number of the second slices. It is also possible for the number of the first slices to be different from the number of the second slices. There could, for example, be more first slices than second slices; this can be the case since a reduction of artifacts because of phase errors can also be possible with a lower local resolution of the navigator MR data. For example, there can be twice (or three times, four times, five times, etc.) as many first slices as second slices.

By the provision of a specific spatial relationship for the changing of the phase, location dependencies can be detected especially precisely in relation to the reduction of phase errors. Reducing the phase errors can therefore be undertaken especially precisely.

For example, the modification of the phase for specific MR data can occur based on such navigator MR data, of which the time of acquisition has a temporal relationship to the acquisition of the specific MR data. For example, the method can further include modifying the phase of the MR data of a specific repetition of the MR measurement sequence based on navigator MR data of a specific repetition of the navigator MR measurement sequence, wherein the specific repetition of the MR measurement sequence is adjacent in time to the specific repetitions of the navigator MR measurement sequence. The phase errors can be reduced especially precisely in this way. This causes the constant magnetic field drift to exhibit a comparatively small change between the measuring of the MR data for the specific first slice and the measuring of the navigator MR data for the at least one specific second slice. An especially precise reduction of the constant magnetic field drift in the MR data thus can be achieved.

For example, the first RF excitation pulse can feature a frequency modulation and/or an amplitude modulation, so that the nuclear magnetization is excited selectively in the first slices of the examination object. As an alternative or in addition, gradient pulses that exhibit an amplitude modulation can be used during the radiating of the first RF excitation pulse. Through a corresponding embodiment of the first RF excitation pulse or of the accompanying gradient pulse, the size of the examination region for which the MR data will be measured can be varied.

The first gradient pulse train can include, for example, a number of gradient pulses. The first gradient pulse train can have a number of gradient pulses with alternating polarities. Each gradient pulse train of the first gradient pulse train can create or form a corresponding first gradient echo. Each first gradient echo can represent the corresponding MR data for one row of k-space.

The execution of the number of repetitions of the MR measurement sequence and of the number of repetitions of the navigator MR measurement sequence in a interleaved manner can involve alternately executing at least one repetition of the MR measurement sequence and at least one repetition of the navigator MR measurement sequence. The number of repetitions of the MR measurement sequence in relation to the number of repetitions of the navigator MR measurement sequence can determine a so-called interleaving factor. Preferably the interleaving factor is in the range of 1-10 or 1-4 or is 1. When the interleaving factor is 1, the same number of repetitions of the MR measurement sequence and repetitions of the navigator MR measurement sequence will be executed. In such a case a repetition of the MR measurement sequence and a repetition of the navigator MR measurement sequence are preferably executed alternately in each case. In other words, the execution of the number of repetitions of the MR measurement sequence and of the number of repetitions of the navigator MR measurement sequence in a interleaved manner is an at least partial time-parallel execution of the number of repetitions of the MR measurement sequence and the number of repetitions of the navigator MR measurement sequence.

Typically, for a smaller (larger) interleaving factor, the accuracy during changing of the phase will be greater (less). Typically artifacts because of phase errors can be compensated for especially well when a smaller interleaving factor is used; this is the case since a large number of navigator MR data are present. In some implementations, however, the time needed for executing the repetitions of the navigator MR measurement sequence can be comparatively large if a smaller interleaving factor is used. This can increase the period of time (measurement time) needed overall for the EPI.

The relaxation of the nuclear magnetization in the first slices can restrict the period of time between the carrying out of sequential repetitions of the MR measurement sequences, which modify the nuclear magnetization in the same slice, (repetition time). This can result in dead time. During this dead time, the nuclear magnetization in the first slices, because of relaxation and or diffusion, can already be so far advanced that an acquisition of significant MR data is no longer possible. In the dead time, the execution of the next repetition of the MR measurement sequence by the not-yet-relaxed, excited component of the nuclear magnetization can be prevented. It is then possible for the execution of the repetitions of the navigator MR measurement sequence to occur during the dead times. Through the use of a comparatively small flip angle for the second RF excitation pulse, the repetition time of the number of repetitions of the MR measurement sequence can be prevented from being overly extended.

The MR measurement sequence can be employed for the widest variety of applications. For example the MR image, which is created based on the MR data, can be employed within the framework of the functional MR imaging (fMRI). An example is the creation of an MR image to present brain activity (blood oxygen level dependent MRT, BOLD MRT).

In a further embodiment can be used in diffusion MR imaging or diffusion weighted MR imaging. In this context, each repetition of the MR measurement sequence includes the application of at least one diffusion gradient pulse. The at least one diffusion gradient pulse is applied, for example, in a specific temporal relationship in relation to the radiating of the first RF excitation pulse. As an alternative or in addition, the at least one diffusion gradient pulse exhibits a specific temporal relationship in relation to the radiating of an RF refocusing pulse, which is radiated after the first RF excitation pulse. The at least one diffusion gradient pulse may be two gradient pulses of equal polarity that surround the first RF excitation pulse and/or the RF refocusing pulse.

The diffusion gradient pulses of different repetitions of the MR measurement sequence can encode different diffusion directions. With diffusion-weighted MR imaging, it is possible to measure the diffusion movement of molecules in body tissue and to create corresponding MR images that illustrate the diffusion movement. Typically diffusion weighted MR imaging can be used for examination regions that are situated in the area of the human brain.

The invention also encompasses an MR apparatus that has at least one processor configured to operate a data acquisition scanner of the MR apparatus so as to execute a number of repetitions of an MR measurement sequence and a number of repetitions of a navigator MR measurement sequence in a interleaved manner. The at least one processor is further configured, for each repetition of the MR measurement sequence, to operate the scanner so as to radiate a first RF excitation pulse, which excites the nuclear magnetization in first slices of an examination object, and to activate a phase-encoded first gradient pulse train for time-parallel creation of first gradient echoes of the nuclear magnetization excited by the first RF excitation pulse, and to read out the first gradient echoes as MR data. The at least one processor is further configured, for each repetition of the navigator MR measurement sequence, to operate the scanner so as to radiate at least one second RF excitation pulse, which excites the nuclear magnetization in second slices of the examination object, and to activate at least one second gradient pulse train for time-sequential creation of second gradient echoes of the nuclear magnetization excited by the second RF excitation pulse, and to read out the second gradient echoes as navigator MR data. The at least one processor is configured to modify the MR data based on the navigator MR data, and to make the modified MT data available from the at least one processor in electronic form, as a data file.

The at least one processor can implement both the tasks of sequence control and the reconstruction and post-processing of the MR data.

With such an MR apparatus, advantages are achieved that are comparable to those achieved with the method in accordance with the invention.

The invention also encompasses a non-transitory electronically-readable storage medium encoded with program code, which can be executed by at least one processor. Execution of the program code causes the inventive method to be carried out. The method includes the execution of a number of repetitions of an MR measurement sequence and a number of repetitions of a navigator MR measurement sequence in a interleaved manner. Each repetition of the MR measurement sequence comprises the radiating of a first RF excitation pulse. The first RF excitation pulse excites the nuclear magnetization in first slices of an examination object. Each repetition of the MR measurement sequence further includes the activation of a phase-encoded first gradient pulse train for time-parallel creation of first gradient echoes of the nuclear magnetization excited by the first RF excitation pulse. Each repetition of the MR measurement sequence further includes the read out of the first gradient echoes as MR data. Each repetition of the navigator MR measurement sequence includes the radiating of at least one second RF excitation pulse. The second RF excitation pulse excites nuclear magnetization in second slices of the examination object. Each repetition of the navigator MR measurement sequence further includes the activation of at least one second gradient pulse train for time-sequential creation of second gradient echoes of the nuclear magnetization excited by the second RF excitation pulse. Each repetition of the navigator MR measurement sequence further includes the read out of the second gradient echoes as navigator MR data. The method further includes the modification of the MR data based on the navigator MR data, and making the modified MR data available in electronic form, as a data file.

The inventive storage medium achieves advantages that are comparable to the advantages achieved with the method in accordance with the invention.

The features described above and features that are described below can be used not only in the explicitly presented combinations, but also in further combinations or in isolation, without departing from the scope of the present invention.

BRIEF DESCRIPTION OF THE DRAWINGS

FIG. 1 schematically illustrates an MR apparatus constructed and operating in accordance with the invention.

FIG. 2 schematically illustrates the execution of a number of repetitions of an MR measurement sequence and a number of repetitions of a navigator MR measurement sequence in a interleaved manner in accordance with an embodiment of the invention, wherein the interleaving factor one.

FIG. 3 schematically illustrates the execution of a number of repetitions of an MR measurement sequence and a number of repetitions of a navigator MR measurement sequence in a interleaved manner in another embodiment of the invention, wherein the interleaving factor is three.

FIG. 4 schematically illustrates a spatial arrangement of first slices of an examination object in an embodiment of the invention, from which MR data are read out in the MR measurement sequence, and further schematically illustrates a spatial arrangement of second slices of the examination object from which navigator MR data are read out in the navigator MR measurement sequence, which can be used to modify the phase of the MR data.

FIG. 5 is a sequence diagram that illustrates a diffusion weighted SMS EPI MR measurement sequence and a navigator MR measurement sequence in accordance with an embodiment of the invention.

FIG. 6 is a sequence diagram that illustrates an SER navigator MR measurement sequence in accordance with another embodiment of the invention.

FIG. 7 schematically illustrates the read out of MR data based on an EPI MR measurement sequence with a gradient pulse train, which has a number of gradient pulses of alternating polarity.

FIG. 8 illustrates N/2 ghosting artifacts of the MR data, which are obtained in an EPI MR measurement sequence.

FIG. 9 is a flowchart of an embodiment of the inventive method.

DESCRIPTION OF THE PREFERRED EMBODIMENTS

The present invention is explained in greater detail below with reference to preferred forms of embodiment that relate to the drawings. In the figures the same reference characters relate to the same or similar elements. The figures are schematic representations of different forms of embodiment of the invention. Elements shown in the figures are not necessarily shown true-to-scale. Instead the different elements in the figures are reproduced such that their function and general purpose will be understandable for the person skilled in the art. Connections and couplings between functional units and elements shown in the figures can also be implemented as an indirect connection or coupling. A connection or coupling can be implemented by wire or wirelessly. Functional units can be implemented as hardware, software or as a combination of hardware and software.

Techniques are described below that make improved multi slice EPI imaging possible, in which gradient echoes are created for a number of slices in parallel in time. These techniques can be employed in conjunction with SMS EPI for example, i.e. for the time-parallel excitation of the nuclear magnetization, the time-parallel creation of gradient echoes and the time parallel measurement of the gradient echoes as MR data, wherein the separation of the collapsed MR data is implemented based on slice-specific reconstruction kernels by means of a PPA technique.

In different examples it is possible for single-slice navigator MR data also to be acquired in addition to such multi-slice MR data described above, in order to change the MR data. The phase of the MR data can be changed for example. As an alternative or in addition the amplitude of the MR data can be changed. This means that the navigator MR data will not be acquired collapsed for a number of slices; a separation is therefore not necessary. This enables a reduced or flexible changed phase encoding of the navigator MR data—e.g. by comparison with the MR data to be changed—to be implemented for example; in some examples the phase encoding of the navigator MR data can also be omitted entirely.

For example N/2 ghosting artifacts can be reduced and/or constant magnetic field drifts reduced by the phase of the MR data being changed. As an alternative or in addition movement artifacts can be reduced.

Different examples are based on the knowledge that a theoretical reduction of the repetition time of the multi slice EPI MR imaging, such as for example SMS EPI, compared to single-slice EPI MR imaging, can frequently not be achieved because of the finite T1 relaxation time of the nuclear magnetization. For example, in diffusion-weighted MR imaging with a repetition time of 4.2 seconds (for example with a constant magnetic field strength of 3 Tesla), by using an SMS EPI technique, in which gradient echoes are created in parallel in time for 2 slices (SMS factor 2), a theoretical repetition time of 4.2 seconds/2=2.1 seconds can be achieved. However a reduction of the repetition time to below 3 seconds results in a loss of contrast for gray matter of the central nervous system, since the nuclear magnetization in the corresponding slices does not completely relax with the relaxation time of for example 2.1 seconds. Therefore in such an example the repetition time is restricted by the T1 relaxation time to a value of close to 3 seconds for example.

Because of the restricting T1 relaxation time a dead time arises in such a case. For example the dead time in the example given above amounts to 3 seconds−2.1 seconds=0.9 seconds. This dead time is used in different examples to carry out repetitions of the navigator MR measurement sequence. Through the choice of a small flip angle of the RF excitation pulses of the navigator MR measurement sequence a further extension of the T1 relaxation time can be restricted or avoided.

FIG. 1 schematically illustrates an MR apparatus 100 that is operable to implement the techniques described above and the techniques that will be described below. The MR apparatus 100 has a scanner 110 that defines a tube 111. The scanner 110 has basic field magnet that produces a constant magnetic field parallel to the longitudinal axis of the scanner 110. The constant magnetic field can exhibit inhomogeneities, i.e. local deviations from a nominal value. The constant magnetic field can also exhibit a drift, i.e. deviations from a nominal value that vary as a function of time.

An examination object, here a person 101, can be moved on a table 102 into the scanner 110. An examination area 101A is, in the example of FIG. 1, in the region of the head of the person 101.

The scanner 110 also has a gradient system 140 for creating gradient fields that are used in MR imaging for spatial encoding of the acquired MR data. Typically the gradient system 140 has at least three gradient coils 141 that can be separately activated and that are well-defined in their positions in relation to one another. The gradient coils 141 are operated by gradient pulses so as to produce the gradient fields create in specific spatial directions (gradient axes). The gradient fields can be used, for example, for slice selection, for frequency encoding (in the readout direction) and for phase encoding. This enables a spatial encoding of the MR data to be achieved.

An RF coil arrangement 121, which can radiate an amplitude modulated and/or frequency-modulated RF excitation pulse into the person to be examined 101, is provided for excitation of certain nuclear spins in the person 101, so as to deflect the magnetization of those nuclear spins from the polarization produced by the constant magnetic field. This enables a transversal magnetization to be created. The flip angle of the RF excitation pulse defines the strength of the deflection. For creating such RF excitation pulses, an RF transmit unit 131 is connected via an RF switch 130 to the RF coil arrangement 121. The RF transmit unit 131 can include an RF generator and an RF amplitude modulation unit. The RF excitation pulses can flip the transverse magnetization 1D slice-selectively or 2D/3D spatially-selectively or globally from the rest position.

Furthermore an RF reception unit 132 is coupled via the RF switch 130 to the RF coil arrangement 121. Via the RF reception unit 132, MR signals of the relaxing transversal magnetization can be acquired or measured (read out) as MR data, e.g. by inductive coupling into the RF coil arrangement 121.

In general it is possible to use separate RF coil arrangements 121 for the radiating of the RF excitation pulses by the RF transmit unit 131 and for the acquisition of the MR data by the RF reception unit 132. For example, a volume coil 121 can be used for the radiating of RF pulses and a surface coil (not shown), which is composed of an array of RF coils, can be used for the acquisition of raw data. For example, the surface coil for the acquisition of the raw data can have thirty-two individual RF coils and thus be especially suitable for PPA techniques. Suitable techniques are known to those skilled in the art, so that further details do not have to be explained herein.

The MR apparatus 100 further has an operating unit 150, which can, for example, include a screen, a keyboard, a mouse etc. User inputs can be captured, and outputs to the user can be realized, via the operating unit 150. For example, individual operating modes or operating parameters of the MR system 100 can be set via the operating unit 150 by the user and/or automatically and/or by remote control.

Furthermore the MR system 100 has a sequence controller 161. The sequence controller 161 is configured to activate the different components 131, 132, 140, in order to execute a measurement sequence. Typically the execution of the measurement sequence includes the excitation and modification of the nuclear magnetization and the subsequent measurement of the data. The sequence controller 161 can be configured to execute an EPI MR measurement sequence, e.g. an SMS EPI MR measurement sequence. The sequence control unit can further be configured to execute a navigator MR measurement sequence. In particular the sequence controller 161 can be configured to execute a interleaved number of repetitions of the MR measurement sequence and of the navigator MR measurement sequence.

The MR system 100 also has a processor 162. The processor 162 can be configured to modify the phase of the MR data based on navigator MR data that are obtained from the navigator MR measurement sequence. The processor 162 can be configured so as, by such techniques for modifying the phase, to reduce N/2 ghosting artifacts and/or to reduce a constant magnetic field drift. The processor 162 can also be configured to implement a separation of the collapsed MR data for the number of slices, for which the SMS EPI MR measurement sequence is implemented.

Although the processor 162 and the sequence controller 161 are shown as separate units in the example in FIG. 1, the sequence controller 161 and the processor 162 can be implemented at least partly together. For example, functionality of the sequence controller 161 can be implemented as software in the processor 162.

FIG. 2 illustrates aspects of the implementation of a number of repetitions 201-1, 201-2 of an MR measurement sequence 201 and a number of repetitions 211-1, 211-2 of a navigator MR measurement sequence 211 in a interleaved manner. In FIG. 2 an example is shown in which the interleaving factor is equal to one, i.e. the MR measurement sequence 201 and the navigator MR measurement sequence 211 are carried out alternately in each case.

For example it would be possible, per repetition 201-1, 201-2 of the MR measurement sequence 201, for all MR data for an image of the examination region 101A to be measured, i.e. for all slices of the examination region 101A to be scanned. In different examples it is also possible, per repetition 201 1, 201-3, for merely a fraction of all slices of the examination region 101A to be measured, for example 2 or 3 or 4 slices. Then consecutive repetitions can map different slices.

In the different repetitions 201-1, 201-2, as an alternative or in addition, other MR parameters can also be varied. For example for different repetitions 201-1, 201-2, a different preparation of the nuclear magnetization can be applied in each case, such as in conjunction with the diffusion-weighted MR imaging or the fMRI. For example, in conjunction with diffusion-weighted MR imaging, the diffusion directions encoded by the at least one diffusion gradient pulse can be varied from repetition to repetition 201-1, 201-2.

Particularly in the case in which, per repetition 201 1, 211 1, 201-2, 211-2, only a fraction of all slices of the examination region will be scanned, it can be beneficial for MR data or navigator MR data to be acquired for locally adjacent slices for temporally adjacent repetitions 201-1, 201-2 of the MR measurement sequence and repetitions 211-1, 211-2 of the navigator MR measurement sequence. For example in the repetition 201-1 for slices A and B, MR data could be acquired; then for the same slices A and B in the temporally adjacent repetition 211-1, navigator MR data could be acquired. For example in the repetition 201-2 for slices C and D, MR data could be acquired; then for the same slices C and D in the temporally adjacent repetition 211-2, navigator MR data could be acquired.

FIG. 2 further shows a period of time 221 for carrying out the MR measurement sequence 201. FIG. 2 also shows a period of time 222 for carrying out the navigator MR measurement sequence 211.

The repetition time defines the period of time between the modification of the nuclear magnetization in identical slices for different repetitions 201-1, 201-2 of the MR measurement sequence. The repetition time thus defines how long the period of time is that is available for the relaxation of the nuclear magnetization in a specific slice. Depending on how many repetitions are needed for scanning all slices of the examination region 101A, the repetition time can vary.

FIG. 3 illustrates the implementation of a number of repetitions 201-1, 201-2, 201-3, 201-4 of the MR measurement sequence 201 and a number of repetitions 211-1 of the navigator MR measurement sequence 211 in a interleaved manner (wherein in FIG. 3, for reasons of clarity, only one single repetition 211-1 of the navigator MR measurement sequence 211 is shown). FIG. 3 shows an example in which the interleaving factor is equal to three, i.e. three repetitions 201-1-201-4 of the MR measurement sequence 201 are initially carried out, before a single repetition 211-1 of the navigator MR measurement sequence 211 is carried out.

It is possible for different interleaving factors or interleaving arrangements for the repetitions 201-1-201-4, 211-1-211-2 to be implemented in different examples. Preferably the interleaving factor lies in the range of 1-10, i.e. the number of the repetitions 201-1-201-4 of the MR measurement sequence 201 is one to ten times as large as the number of the repetitions 211-1, 211-2 of the navigator MR measurement sequence 211. Further examples for the interleaving factor lie in the range of 1-4 or are equal to 1.

In general it can be beneficial for a close temporal relationship to exist between the measurement of the MR data and the measurement of the navigator MR data that are used to change the MR data. This is achieved by executing the measurements in a interleaved manner. For example, in the scenario of FIG. 3, the navigator MR data, which is obtained from the repetition 211-1 of the navigator MR measurement sequence 211, will be used for modifying the phase of the MR data, which is obtained from the repetitions 201-3 and 201-4 of the MR measurement sequence 201. Such a temporally adjacent relationship can ensure that the constant magnetic field drift has only experienced a comparatively small change or that no systematic changes have taken place in relation to the variables influencing the N/2 ghosting artifacts. In addition, through such a temporally adjacent relationship, movement artifacts can be reduced especially effectively. Above and beyond this, in the scenario of FIG. 3, the navigator MR data, which is obtained from the repetition 211-1 of the navigator MR measurement sequence 211, is also used for example to change the phase of the MR data, which is obtained from the repetition 201-2 of the MR measurement sequence 201; for this repetition 201-2 the repetition 211-1 is closest in time, i.e. is also temporally adjacent.

FIG. 3 also shows aspects in relation to a dead time 225. The dead time 225 can occur, for example, because of limitations by the T1 relaxation time and/or limitation by a diffusion speed in the diffusion-weighted MR imaging. After the period of time 221 for example the signal of the gradient echoes can already have decreased so much that no further measurement of MR data can be carried out. In the dead time 221 the navigator MR measurement sequence 211 can be carried out.

FIG. 4 illustrates aspects in relation to slices 301-306 of the examination region 101A for which MR data is measured within the framework of the MR measurement sequence 201 or navigator MR data is measured within the framework of the navigator MR measurement sequence 211. In the example of FIG. 4 both the slices 301-306 (diagonal solid lines and horizontal dotted lines), for which the MR data are acquired, as well as the slices 302, 304 and 306 (horizontal dotted lines), for which the navigator MR data are acquired, are situated within the examination region 101A. In the example of FIG. 2 MR data are measured for twice as many slices 301-306 as for navigator MR data.

In general different relationships can exist between the slices 301-306, for which the MR data can be measured, and the slices 302, 304, 306, for which the navigator MR data can be measured. In general it can be preferable for a comparatively close spatial relationship to exist between the slices 301 306, for which the MR data are measured, and the slices 302, 304, 306, for which the navigator MR data is measured. It can be especially worth making the effort for example for there to be an identity between the slices for which the navigator MR data are measured, and the slices for which the MR data is measured. Then there can be an especially precise reduction of phase errors by changing of the MR data on the basis of the navigator MR data. Where the phase is modified for slice-specific MR data, a close spatial relationship can be taken into account for specific slice-specific MR data within the framework of the changing of the phase: thus, in the example of FIG. 4 for example, the slice-specific MR data for the slice 303 based on the navigator MR data of the slice 302 and/or of the slice 304, i.e. of the adjacent slices, can be changed. For example in the embodiment of FIG. 4, the slice-specific MR data of the slice 304 could be changed based on the navigator MR data of the slice 304.

Corresponding MR data for all assigned slices 301-306 of the examination region 101A or for only parts of the slices 301 306 of the examination region can be acquired per repetition 201-1, 201-2, 211-1, 211-2 of the MR measurement sequence or of the navigator MR measurement sequence.

FIG. 5 is a sequence diagram that shows a repetition of the MR measurement sequence 201 and a temporally adjacent repetition of the navigator MR measurement sequence 211. FIG. 5 shows an RF transmit channel and an RF measurement channel 410, as well as a readout gradient channel 420 and a phase encoding gradient channel 430. The channel for slice selection gradients is not shown in FIG. 5.

The execution of the MR measurement sequence 201 initially comprises the radiating of an RF excitation pulse 411. The RF excitation pulse 411 excites the nuclear magnetization in a number of slices 301-306 in parallel in time. The number of excited slices 301-306 is determined by the SMS factor and can e.g. lie in the range of 2-6, or is preferably equal to 2.

Subsequently a diffusion module 421 is activated, which has one or more diffusion gradient pulses (not shown in FIG. 5) and/or one or more RF refocusing pulses. The diffusion gradient pulses can for example encode a repetition specific diffusion direction. The diffusion module 421 is optional.

In the example of FIG. 5 an RF refocusing pulse 412 is subsequently radiated. The RF refocusing pulse 412 is optional. In further examples more than one RF refocusing pulse 412 could also be radiated. In different embodiments diffusion module 421 can include the RF refocusing pulse 412. In particular it can be possible for example for a number of diffusion gradient pulses (not shown in FIG. 5) to surround the RF refocusing pulse.

Subsequently a phase-encoded gradient pulse train 412, 431 is applied, which creates parallel in time a series of gradient echoes 413 of the nuclear magnetization excited by the RF excitation pulse 411 (in the example of FIG. 5 four gradient echoes are created; in general a greater number of gradient echoes can be created).

In FIG. 5 the dashed line shows a decrease of the amplitude of the RF signals of the gradient echoes 413 for greater echo times. This decrease is caused by the diffusion of the nuclear magnetization and by the T1 relaxation time. This decrease restricts the number of the gradient echoes 413 for which significant MR data can be measured.

Each of the gradient echoes 413 corresponds to a row of k-space and contains information for all slices 301-306 that have been excited by the RF excitation pulse 411. The corresponding information is measured as MR data. The respective row is defined by the phase encoding of the gradient pulse train 431.

Subsequent to the carrying out of the repetition of the MR measurement sequence a repetition of the navigator MR measurement sequence 211 is carried out. The execution of the repetition of the navigator MR measurement sequence 211 comprises the radiating of a slice-selective RF excitation pulse 415, which excites the nuclear magnetization slice-selectively in a specific slice 302, 304, 306 (a corresponding gradient pulse for slice selection is not shown in FIG. 5). Subsequently a gradient pulse train 425 is activated, which creates a series of gradient echoes 416 of the nuclear magnetization excited by the RF excitation pulse 415. Each of the gradient echoes 416 corresponds to a row of k-space and contains information only for those slices 302, 304, 306 in which the nuclear magnetization has been excited by the RF excitation pulse 415. The corresponding information is measured as navigator MR data.

Subsequently, a further slice-selective RF excitation pulse 417 is radiated, which excites the nuclear magnetization in a further slice 302, 304, 306 that is different from the slice in which the RF excitation pulse 415 excites the nuclear magnetization. A further gradient pulse train 426 creates a series of further gradient echoes 418. In turn, navigator MR data for the further slice 302, 304, 306 are obtained.

In order to achieve a short repetition time, the flip angle of the RF excitation pulse 415, 417 is preferably comparatively small, for example compared to the flip angle of the RF excitation pulse 411. For example the flip angle of the RF excitation pulse 415, 417 could lie in the range of 2-40°, preferably in the range of 3-10°. Small flip angles for the RF excitation pulse 415, 416 can be promoted by the absence of phase encoding, since in this way a stronger RF signal integrated over all rows is obtained. The T1 relaxation time of the nuclear magnetization excited by the RF excitation pulse 411 is not significantly increased by the small flip angle.

It can be seen from FIG. 5 that the gradient pulse trains 425, 426 are not phase-encoded; in other examples it would also be possible for the gradient pulse trains 425, 426 of the navigator MR measurement sequence 211 to be phase-encoded, wherein however to restrict the duration 222 the resolution of the navigator MR data is preferably smaller than the resolution of the MR data in the phase-encoding direction. On the basis of phase-encoded navigator MR data for example a reduction of movement artifacts in the MR can be undertaken.

FIG. 6 is a sequence diagram and illustrates aspects in relation to the application of a single gradient pulse train 427 within the framework of the navigator MR measurement sequence 211. The navigator MR measurement sequence 211 of FIG. 6 could be combined with the measurement sequence 201 of FIG. 5, for example.

In FIG. 6 an SER EPI navigator MR measurement sequence is used wherein, by a single gradient pulse train 427, time-sequential gradient echoes 416, 418 are created for the different slices 302, 304, 306. This is illustrated by the phase response 450 for the slices 302 and 304. An SER EPI navigator MR measurement sequence can e.g. in particular be worth the effort for the reduction of phase errors of a BOLD fMRI MR measurement sequence. This is the case since the repetition time of BOLD fMRI MR measurement sequences, because of often smaller flip angles for the MR measurement sequence, is typically not limited by the T1 relaxation time (or diffusion) and thus the dead time 225 is especially small or infinitesimal. In order not to greatly extend the measurement duration it can be beneficial to have a short duration 202 here.

From a comparison of FIGS. 5 and 6 for example it can be seen that the number of the gradient echoes 416, 418 can vary. Between two and eight gradient echoes can be created per slice 302, 304, 306 of the navigator MR measurement sequence 211 for example, wherein preferably three gradient echoes can be created. In different examples more than eight gradient echoes per slice 302, 304, 306 of the navigator MR measurement sequence 211 can also be created.

FIG. 7 illustrates aspects in relation to phase errors that can occur in MR measurement data 500. MR images that are created by means of EPI MR measurement sequences can be susceptible to N/2 ghosting artifacts as a result of the alternating sorting-in of MR measurement data 500. One cause of this can be that the scanning raster with which the MR data are measured is not adjusted to the center of the gradient pulses of the gradient pulse train 422 (as shown in FIGS. 5 and 7 in each case by the horizontal arrows). FIG. 7 schematically shows the position of two gradient echoes S1 and S2 in a shift of this kind. The shifting of the gradient raster means that the maxima of the gradient echoes in each row of k-space are also shifted. Because of the alternating sorting-in of the MR measurement data 500 for different rows of the raw data matrix S(i,j) this leads, as shown in FIG. 7, to the MR measurement data 500 having maxima that correspond to the gradient echoes S1, S2 at different positions of the different rows of k-space. In the raw data matrix S(i,j) the corresponding signals therefore no longer lie under one another. This results in N/2 ghosting artifacts.

FIG. 8 illustrates N/2 ghosting artifacts 510 in the MR measurement data 500 of a specific slice 301. An object A is shifted in this case upward and downward in each case by half the number of rows of the entire image matrix, i.e. of the Fourier-transformed raw data matrix S(i,j). In this way ghost images A' and A" arise.

FIG. 9 is a flow diagram that illustrates an embodiment of the inventive method. Initially, in step 1001, a repetition 201-1-201-4 of the MR measurement sequence 201 is carried out. In step 1002 a check is made as to whether subsequently a repetition 211-1, 211-2 of the navigator MR measurement sequence 211 should be carried out. For example, in step 1002 the interleaving factor can be taken into account. If the result of the check in step 1002 is that subsequently the repetition of the navigator MR measurement sequence 211 should be carried out, then in step 1003 a repetition 211-1, 211-2 of the navigator MR measurement sequence 211 is carried out.

Subsequently, in step 1004, a check is made as to whether an MR measurement sequence 201 should be carried out. A check can be made in step 1004 for example as to whether sufficient MR data has already been measured in order to create an MR image. If the result of the check in step 1004 is that a further MR measurement sequence 201 should be carried out, then the steps 1001-1003 are carried out again.

Otherwise, in step 1005, the phase of the previously measured MR data, which has been obtained on the basis of the MR measurement sequences from step 1001, is changed based on the navigator MR data. The navigator MR data are obtained on the basis of the navigator MR measurement sequences from step 1003. In step 1005 an N/2 ghost artifact 510 and/or a constant magnetic field drift can be reduced.

Optionally, before step 1005, there can also be the separation of the MR data into portions that belong to different slices 301 306. For this SMS EPI techniques based on slice-selective reconstruction kernels of PPA techniques can be employed.

Optionally there can also be the creation of an MR image subsequent to step 1005. For example the MR image could be stored or output to the user. The MR image could, for example, be indicative for the diffusion of molecules in the area of the object A.

In summary, techniques have been described here that make possible a precise reduction of phase errors.

By comparison with reference techniques that are based on an embedding of the gradient echoes for the navigator MR data in the SMS EPI MR measurement sequence itself, a reduced echo time can be achieved. This can in particular be worth the effort for MR systems with comparatively limited amplitudes of the gradient pulses, since in such scenarios a comparatively long echo time already results because of hardware conditions.

The techniques described herein offer a great flexibility in relation to the phase encoding of the navigator MR data, since no multi-slice collapsing of the navigator MR data is present.

The features of the described embodiments and aspects of the invention can of course be combined with one another. In particular, the features can not only be used in the described combinations, but also in other combinations or on their own, without departing from the scope of the invention.

The different examples above have been explained for example in relation to the modification of the phase of the MR data. In particular different examples have been explained in relation to the reduction of a constant magnetic field drift in the MR data or for reduction of N/2 ghosting artifacts in the MR data. Corresponding techniques described herein can also be used as an alternative or in addition for modifying the amplitude of the MR data based on the navigator MR data, e.g. in order, as an alternative or in addition, to carry out a reduction of movement artifacts.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring magnetic resonance (MR) data, comprising:

from a computer, operating an MR data acquisition scanner to execute a plurality of repetitions of an MR data acquisition sequence interleaved with a plurality of repetitions of a navigator MR acquisition sequence;

from said computer, operating said MR data acquisition scanner in each repetition of said MR data acquisition sequence to radiate a first radio-frequency (RF) excitation pulse into an examination object that excites nuclear magnetization in first slices of the examination object, and to activate a phase-encoding first gradient pulse train that creates time-parallel first gradient echoes of the nuclear magnetization excited by the first RF excitation pulse in said first slices, and to read out said first gradient echoes as MR data;

from said computer, operating said MR data acquisition scanner in each repetition of said navigator MR acquisition sequence to radiate at least one second RF excitation pulse, with a flip angle in a range between 2° and 40°, that excites nuclear magnetization in second slices of the examination object, and to activate at least one second gradient pulse train that creates time-sequential second gradient echoes of the nuclear magnetization excited by the second RF excitation pulse in said second slices, and to read out said second gradient echoes as navigator MR data;

in said computer, changing said MR data dependent on said navigator MR data, thereby generating changed MR data; and from said computer, making the changed MR data available in electronic form as a data file.

2. A method as claimed in claim 1 comprising, from said computer, operating said MR data acquisition scanner in each repetition of said MR data acquisition sequence to activate at least one diffusion gradient pulse, with respective diffusion gradient pulses of different repetitions of said MR data acquisition sequence encoding different diffusion directions.

3. A method as claimed in claim 1 comprising, from said computer, operating said MR data acquisition scanner to execute said MR data acquisition sequence for a duration that is smaller than a repetition time of the number of repetitions of said MR data acquisition sequence, and to execute said navigator MR acquisition sequence during respective dead times that occur because of said smaller duration.

4. A method as claimed in claim 1 comprising, from said computer, operating said MR data acquisition scanner to radiate said at least one second RF excitation pulse with a flip angle in a range between 3° and 10°.

5. A method as claimed in claim 1 comprising, from said computer, operating said MR data acquisition scanner to execute said repetitions of said MR data acquisition sequence and said repetitions of said navigator MR acquisition sequence with a interleaving factor in a range between 1 and 10.

6. A method as claimed in claim 1 comprising, from said computer, operating said MR data acquisition scanner to execute said repetitions of said MR data acquisition sequence and said repetitions of said navigator MR acquisition sequence with a interleaving factor in a range between 1 and 4.

7. A method as claimed in claim 1 comprising, from said computer, operating said MR data acquisition scanner to execute said repetitions of said MR acquisition sequence and said repetitions of said navigator MR acquisition sequence with a interleaving factor equal to 1.

8. A method as claimed in claim 1 comprising, from said computer, operating said MR data acquisition scanner to activate said at least one second gradient pulse train as a second phase-encoding gradient pulse train, each of said first phase-encoding gradient pulse train and said second phase-encoding gradient pulse train being effective in a phase-encoding direction, with a resolution of said MR data in said phase-encoding direction being greater than a resolution of said navigator MR data in said phase-encoding direction.

9. A method as claimed in claim 8 wherein said examination object exhibits movement, and comprising, in said computer, changing said MR data dependent on said navigator MR data to reduce movement artifacts in said MR data that occur due to said movement.

10. A method as claimed in claim 1 comprising, from said computer, operating said MR data acquisition scanner in said navigator MR acquisition sequence to activate a single second gradient pulse train in each repetition.

11. A method as claimed in claim 1 comprising, in said computer, changing said MR data dependent on said navigator MR data by changing a phase of said MR data dependent on said navigator MR data.

12. A method as claimed in claim 11 comprising, in said MR data acquisition scanner, generating a constant magnetic field during acquisition of said MR data that exhibits a constant magnetic field drift, and changing said phase of said MR data to reduce an effect of said constant magnetic field drift on said MR data.

13. A method as claimed in claim 11 comprising, in said computer, changing said phase of said MR data to reduce N/2 ghosting artifacts in said MR data.

14. A method as claimed in claim 1 comprising, from said computer, operating said MR data acquisition scanner to radiate said first RF excitation pulse to excite nuclear magnetization in said first slices parallel in time in each repetition of said MR data acquisition sequence.

15. A method as claimed in claim 1 comprising, from said computer, operating said MR data acquisition scanner to radiate said second RF excitation pulse slice-selectively in each repetition of said navigator MR sequence and for each second slice.

16. A method as claimed in claim 1 comprising, in said computer, changing said MR data dependent on said navigator MR data by changing a phase of said MR data of a selected repetition of said MR data acquisition sequence dependent on navigator MR data acquired in a selected repetition of said navigator MR acquisition sequence, said selected repetition of said MR data acquisition sequence being adjacent in time to said selected repetition of said navigator MR acquisition sequence.

17. A magnetic resonance (MR) apparatus comprising:
an MR data acquisition scanner;
a computer configured to operate said MR data acquisition scanner to execute a plurality of repetitions of an MR data acquisition sequence interleaved with a plurality of repetitions of a navigator MR acquisition sequence;
said computer being configured to operate said MR data acquisition scanner in each repetition of said MR data acquisition sequence to radiate a first radio-frequency (RF) excitation pulse into an examination object that excites nuclear magnetization in first slices of the examination object, and to activate a phase-encoding first gradient pulse train that creates time-parallel first gradient echoes of the nuclear magnetization excited by the first RF excitation pulse in said first slices, and to read out said first gradient echoes as MR data;
said computer being configured to operate said MR data acquisition scanner in each repetition of said navigator MR acquisition sequence to radiate at least one second RF excitation pulse, with a flip angle in a range between 2° and 40°, that excites nuclear magnetization in second slices of the examination object, and to activate at least one second gradient pulse train that creates time-sequential second gradient echoes of the nuclear magnetization excited by the second RF excitation pulse in said second slices, and to read out said second gradient echoes as navigator MR data;

said computer being configured to change said MR data dependent on said navigator MR data, thereby generating changed MR data; and said computer being configured to make the changed MR data available in electronic form as a data file.

18. A transitory, computer-readable data storage medium encoded with programming instructions, said storage medium being loaded into a computer of a magnetic resonance (MR) apparatus that comprises an MR data acquisition scanner, and said programming instructions causing said computer to:

operating said MR data acquisition scanner to execute a plurality of repetitions of an MR data acquisition sequence interleaved with a plurality of repetitions of a navigator MR acquisition sequence;

operate said MR data acquisition scanner in each repetition of said MR data acquisition sequence to radiate a first radio-frequency (RF) excitation pulse into an examination object that excites nuclear magnetization in first slices of the examination object, and to activate a phase-encoding first gradient pulse train that creates time-parallel first gradient echoes of the nuclear magnetization excited by the first RF excitation pulse in said first slices, and to read out said first gradient echoes as MR data;

operate said MR data acquisition scanner in each repetition of said navigator MR acquisition sequence to radiate at least one second RF excitation pulse, with a flip angle in a range between 2° and 40°, that excites nuclear magnetization in second slices of the examination object, and to activate at least one second gradient pulse train that creates time-sequential second gradient echoes of the nuclear magnetization excited by the second RF excitation pulse in said second slices, and to read out said second gradient echoes as navigator MR data;

change said MR data dependent on said navigator MR data, thereby generating changed MR data; and make the changed MR data available in electronic form as a data file.

\* \* \* \* \*